(12) United States Patent
Figie et al.

(10) Patent No.: US 9,899,953 B2
(45) Date of Patent: Feb. 20, 2018

(54) METHOD AND APPARATUS FOR DETECTING GROUND FAULTS IN INVERTER OUTPUTS ON A SHARED DC BUS

(71) Applicant: Rockwell Automation Technologies, Inc., Mayfield Heights, OH (US)

(72) Inventors: John R. Figie, Germantown, WI (US); Zoran Vrankovic, Greenfield, WI (US); Mark A. Gries, Milwaukee, WI (US); Craig Winterhalter, Cedarburg, WI (US); Gennadi Sizov, Shorewood, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 15/193,181

(22) Filed: Jun. 27, 2016

(65) Prior Publication Data

US 2017/0373630 A1 Dec. 28, 2017

(51) Int. Cl.
| | |
|---|---|
| *G05B 5/00* | (2006.01) |
| *H02H 7/08* | (2006.01) |
| *H02P 29/024* | (2016.01) |
| *H02M 7/537* | (2006.01) |
| *H02M 1/32* | (2007.01) |
| *H02P 27/06* | (2006.01) |
| *G01R 31/02* | (2006.01) |
| *G01R 31/42* | (2006.01) |
| *G05B 19/042* | (2006.01) |

(52) U.S. Cl.
CPC .......... *H02P 29/024* (2013.01); *G01R 31/025* (2013.01); *G01R 31/42* (2013.01); *H02M 1/32* (2013.01); *H02M 7/537* (2013.01); *H02P 27/06* (2013.01); *G05B 19/0425* (2013.01)

(58) Field of Classification Search
None
See application file for complete search history.

(56) References Cited

U.S. PATENT DOCUMENTS

| | | | |
|---|---|---|---|
| 2012/0212172 A1* | 8/2012 | Valdez | G01R 31/025 318/805 |
| 2015/0091485 A1* | 4/2015 | Lemberg | G05B 19/0425 318/453 |

* cited by examiner

*Primary Examiner* — Bentsu Ro
*Assistant Examiner* — Zemenay Truneh
(74) *Attorney, Agent, or Firm* — Boyle Fredrickson, SC

(57) ABSTRACT

A system to detect a ground fault at the output of an inverter section prior to powering up a motor drive system is disclosed. A low voltage power supply is connected to the DC bus prior to connecting the input power source to the rectifier section. If a ground fault exists, the voltage potential on the DC bus causes conduction through one of the freewheeling diodes connected in parallel to the power switching device on the output of the inverter section. A fault detection circuit generates a signal corresponding to the presence of the low voltage potential when the low voltage is applied to the DC bus. If a ground fault is present at the output of one of the inverter sections, the motor drive system prevents the AC voltage from being applied to the rectifier section.

20 Claims, 5 Drawing Sheets

METHOD AND APPARATUS FOR DETECTING GROUND FAULTS IN INVERTER OUTPUTS ON A SHARED DC BUS

BACKGROUND OF THE INVENTION

The subject matter disclosed herein relates generally to detecting fault conditions in a motor drive and, more specifically, to detecting a ground fault in a motor drive system.

Common AC motors use three-phase electrical power connected to the stator windings of a motor to run the motor. Each stator winding is connected to a different conductor from a three-phase power source, in which each conductor delivers a different phase of the electrical power to the motor. The three-phase power source may be a direct connection to line power, but more commonly, the motor is connected to an adjustable speed motor drive (ASD). The ASD allows for speed control of the motor not available by connecting the motor directly to line power.

As is known in the art, there are many electrical topologies for ASDs used to convert the fixed voltage and frequency from the line input into a controlled voltage and frequency output for a three-phase motor. One common topology includes a rectifier section which converts the line power into a DC voltage used to charge a DC bus section of the ASD. An inverter section then uses a switching algorithm, typically pulse width modulation (PWM), to convert the DC voltage from the DC bus into a variable voltage and frequency output to the motor. Controlling the variable voltage and frequency output to the motor controls the speed at which the motor rotates.

In another topology, a single rectifier section may be configured to supply a DC voltage to multiple inverter sections. The inverter sections may be distributed on or near the motor the inverter section is intended to control. The rectifier section again converts the line power into a DC voltage for a DC bus, but each inverter section is connected to and receives power from the same DC bus. The components of the rectifier section are, therefore, selected such that their power rating is sufficient to supply power to all of the inverter sections connected to the DC bus.

Each of the motors connected to one of the inverter sections typically includes a ground connection on the chassis of the motor. A conductor is run between the ground connection on the motor and a ground connection on the inverter section. The ground connection on the inverter section is, in turn, run to a centrally ground connection such that the chassis of the motors are held at zero voltage potential to minimize the risk of electrical shock or equipment damage. Common wiring practice utilizes a four-wire cable or bundle of conductors that includes three hot conductors and one ground conductor which runs between the inverter section and the motor. Each phase of the output voltage supplied by the inverter section is connected to one of the hot conductors and the ground conductor is connected between the ground connection on the motor and the ground connection on the inverter.

Although each conductor is typically labeled, the potential exists for one of the hot conductors to be crossed with the ground conductor between the inverter section and the motor. Such a wiring error causes a ground fault at the output of the inverter section and will likely result in a failure in the motor, the inverter section, or in the rectifier section supplying power to the inverter section should the input power and, consequently, normal DC bus voltage be applied to the motor drive system with the incorrect wiring. Further, a failure in the system, such as a short circuit in the motor windings or between conductors connecting the motor to the inverter, can also cause a ground fault.

Thus, it would be desirable to provide a system to detect a ground fault prior to applying the input power to the motor drive system.

BRIEF DESCRIPTION OF THE INVENTION

The subject matter disclosed herein describes a system to detect a ground fault prior to applying the input power to a motor drive system. A low voltage power supply is connected to the DC bus prior to connecting the input power source to the rectifier section. If a ground fault exists at the output of the inverter section, the voltage potential on the DC bus forward biases one of the freewheeling diodes connected in parallel to the power switching device on the output of the inverter section, charging the DC bus up to the low voltage. Whether the upper or lower freewheeling diode is activated is a function of the polarity of the voltage potential present on the DC bus. Because multiple inverter sections of varying power ratings may be connected to the same DC bus it is desirable to include a current limiting device, such as a resistor, in series with the voltage source, such that the current conducted on the DC bus and through the freewheeling diode is less than the current rating of the lowest rated inverter section expected to be connected to the DC bus.

A fault detection circuit may be included that generates a signal corresponding to current flowing on the DC bus and through one of the freewheeling diodes when the low voltage is applied to the DC bus. The signal is transmitted back to a controller configured to open and close an AC contactor connected in series between the input power and the rectifier section. If the signal indicates a ground fault is present at the output of one of the inverter sections, the controller keeps the contactor open, preventing the AC voltage from being applied to the rectifier section, which otherwise would supply full DC bus voltage on the DC bus resulting in equipment damage. If the signal indicates no ground fault at the output of the inverter sections, the controller closes the contactor and allows the motor drive system to complete its power up sequence.

According to one embodiment of the invention, a system to detect a ground fault at an output of an inverter is disclosed, where the inverter is connected to a DC bus. The system includes a power supply, a fault detection circuit, and a control circuit. The power supply is operable to provide a test voltage on the DC bus, where the test voltage is less than half of a minimum DC bus operating voltage. The fault detection circuit is operatively connected to the DC bus to generate a fault signal responsive to applying the test voltage on the DC bus when the ground fault is present at the output of the inverter. The control circuit is operable to delay a normal DC bus operating voltage from being applied to the DC bus while the test voltage is provided to the DC bus, detect the fault signal, and prevent the normal DC bus operating voltage from being applied to the DC bus when the fault signal is detected.

According to another embodiment of the invention, a method for detecting a ground fault at an output of an inverter is disclosed, where the inverter is connected to a DC bus. A test voltage is applied on the DC bus prior to applying a normal operating voltage on the DC bus, where the test voltage is less than half of a minimum DC bus operating voltage. A voltage potential on the DC bus is detected with a voltage sensor when the test voltage is applied to the DC bus, and a fault signal is generated with a fault detection circuit when the voltage potential on the DC bus is detected. The normal operating voltage is prevented from being applied to the DC bus with a control circuit when the fault signal is generated.

According to still another embodiment of the invention, a system to detect a ground fault in a motor drive system is disclosed. The motor drive system has a converter module operatively connected between an AC input power source and a DC bus and a plurality of inverters operatively connected to the DC bus. The system includes a power supply, a fault detection circuit, and a control circuit. The power supply is operable to provide a test voltage on the DC bus, where the test voltage is less than half of a minimum DC bus operating voltage. The fault detection circuit is located within the converter module and operatively connected to the DC bus to generate a fault signal responsive to applying the test voltage when the ground fault is present at an output of one of the plurality of inverters. The control circuit is within the converter module and operable to delay a normal DC bus operating voltage from being applied to the DC bus while the test voltage is provided to the DC bus, detect the fault signal, and prevent the normal DC bus operating voltage from being applied to the DC bus when the fault signal is detected.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
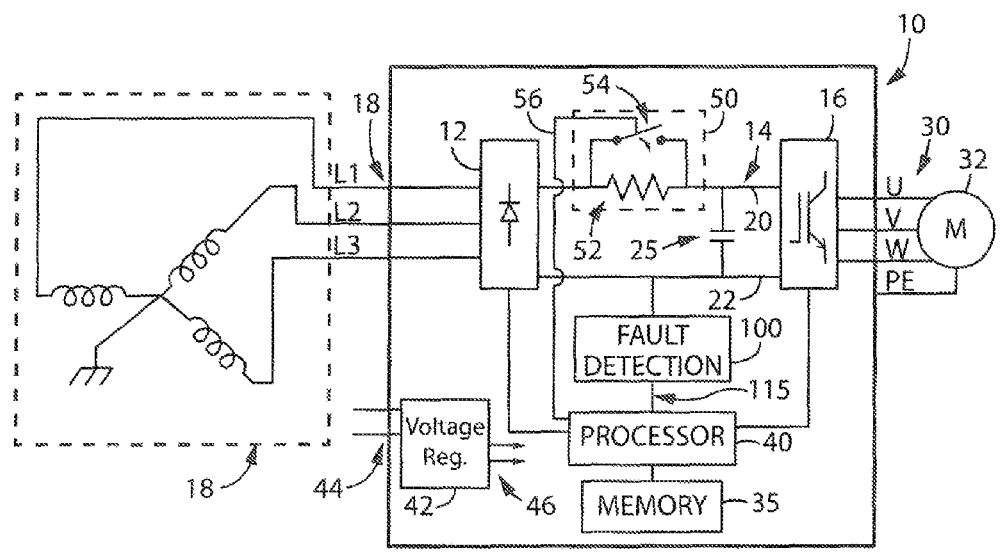
FIG. 1 is a schematic representation of an ASD illustrating a rectifier, a DC bus, and an inverter section according to one embodiment of the invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION OF THE PREFERRED EMBODIMENTS

Turning initially to FIG. 1, a common topology for an Adjustable Speed Drive (ASD) 10 incorporating one embodiment of the invention is illustrated. The ASD 10 includes a rectifier section 12, a DC bus section 14, and an inverter section 16. The ASD 10 receives a three-phase AC input voltage 18 into the rectifier section 12. The rectifier section 12 may include passive or active rectification, for example diodes, thyristors, silicon controlled rectifiers, or transistors as is known in the art, to convert the three-phase AC input voltages into a DC voltage. The DC voltage is present between the positive rail 20 and the negative rail 22 of the DC bus section 14. Typical DC voltages may be a positive or negative 650 volts for a common 460 volt, three-phase AC input voltage. To maintain a stiff DC voltage on each of the positive and negative bus rails, 20 and 22, a DC bus capacitor 25 is included between the rails 20 and 22, where a stiff DC voltage remains approximately equal to the peak value of the AC input voltage 18 despite transient voltages and currents present on the DC bus, for example, when there is a change in the load on the output of the ASD 10. The DC bus capacitor 25 may consist of one or more capacitors connected in series, parallel, or any combination thereof, as is known in the art.

Figure 2:
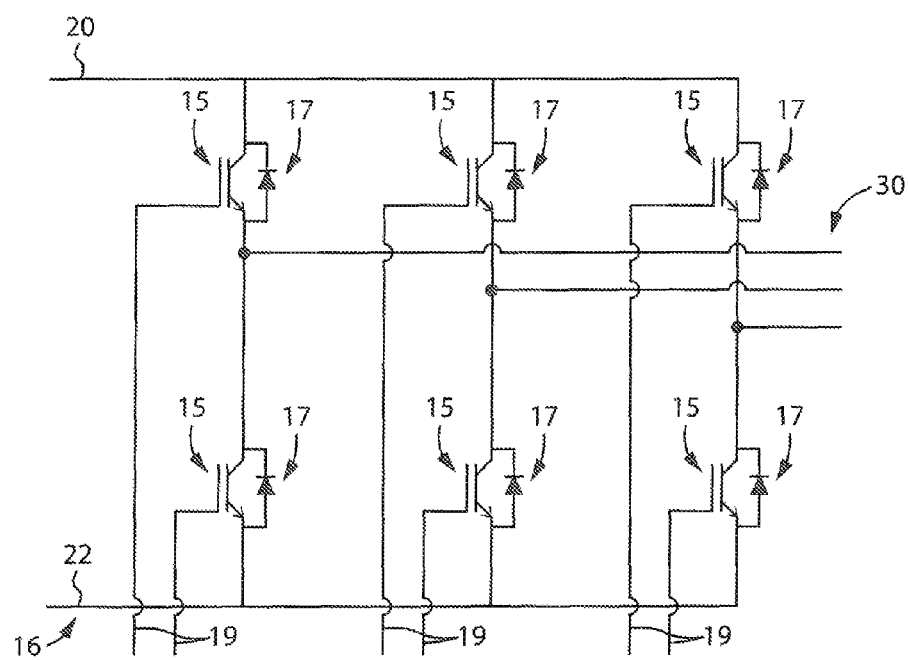
FIG. 2 is a schematic representation of one embodiment of an inverter section for use in the ASD of FIG. 1.

The DC bus section 14 is connected between the rectifier section 12 and the inverter section 16. The inverter section 16 consists of switching elements, such as transistors or thyristors as is known in the art. FIG. 2 illustrates an exemplary embodiment of an inverter section 16 wherein a transistor 15 and a diode 17 are connected in pairs between the positive rail 20 and each phase of the output voltage 30 as well as between the negative rail 20 and each phase of the output voltage 30. The inverter section 16 converts the DC voltages from the positive rail 20 and the negative rail 22 into a controlled three phase output voltage 30 to the motor 32.

One or more modules are used to control operation of the motor drive 10. The modules may be stored programs executed on a processor, logic circuits, or a combination thereof. The modules used to control operation of the motor drive 10 will be referred to herein generally as a control circuit. According to the illustrated embodiment, the control circuit of the illustrated motor drive 10 includes a fault detection circuit 100, a non-transitory storage device, or memory 35, and a processor 40. It is contemplated that the control circuit for the ASD may include additional devices, such as a dedicated processor to generate gate signals 19, buffers, analog-to-digital converters and the like as may be needed to control operation of the ASD. The non-transitory storage device, or memory 35, is configured to store data and programs, which include a series of instructions executable by the processor 40. It is contemplated that the memory 35 may be a single device, multiple devices, or incorporated, for example, as a portion of another device such as an application specific integrated circuit (ASIC). The processor 40 is in communication with the memory 35 to read the instructions and data as required to control operation of the motor drive 10. According to one embodiment of the invention, the processor 40 receives a reference signal identifying desired operation of the motor 32 connected to the motor drive 10. The reference signal may be, for example, a speed reference or a torque reference. The processor 40 similarly receives feedback signals from sensors indicating the present operation of the motor drive 10. The feedback signals may include, but are not limited to, the magnitude of voltage and/or current present at the input 18, on the DC bus 14, or at the output 30 of the motor drive 10. The processor 40 executes a control module responsive to the reference signal and the feedback signals to generate control signals 19 which selectively enable the switching elements 15 in the inverter section 16.

The ASD illustrated in FIG. 1 further includes a pre-charge circuit 50. On power-up, the DC bus 14 typically has no voltage present. The DC voltage is applied to the DC bus as a result of connecting the AC input power 18 to the rectifier section 12. A contactor 11 (see FIG. 5), or other switch, may be provided to connect/disconnect the AC input power 18 with the rectifier section 12. The application of the AC input power 18 through a diode rectifier represents essentially a step change in DC voltage on the DC bus 14. The DC bus capacitor 25, however, requires some time to charge from zero volts up to the normal operating voltage of the DC bus. The in-rush current into the rectifier section 12 and on to the DC bus as the DC bus capacitor 25 charges can be large if the AC input power 18 and, consequently, the normal DC bus operating voltage is applied directly to the DC bus capacitor 25. The pre-charge circuit 50 includes a charge resistor 52 and a pre-charge switch 54 which is controlled by a pre-charge signal 56 generated by the processor 40. On power-up, the pre-charge signal 56 is off causing the pre-charge switch 54 to remain open and allowing the charge resistor 52 to be connected to the DC bus 14. The charge resistor 52 and DC bus capacitor 25 act together to form an R-C circuit controls the rate at which the voltage rises on the DC bus 14 and, thereby reduces the in-rush current. When the voltage on the DC bus 14 reaches a predefined level, the processor 40 sets the pre-charge signal 56 to close the pre-charge switch 54. When closed, the pre-charge switch 54 bypasses the charge resistor 52 such that the pre-charge switch 54t does not conduct current during normal operation of the ASD. As a result, the power rating and size of the charge resistor 52 are smaller because the charge resistor 52 needs only to handle the initial charge current for a short duration and not full operating current on the DC bus 14 during normal operation of the ASD.

The ASD further includes a fault detection circuit 100, as will be discussed in more detail below, and a voltage regulator 42. The voltage regulator receives power at an input 44 and supplies control voltages 46 at one or more voltage levels to the various components and circuits within the ASD 10 or converter module 6. It is contemplated that the control voltages 46 may be any voltage level required within the ASD 10 or converter module 6 including, but not limited to multiple DC voltages between 3-48 volts or 110 VAC.

Figure 3:
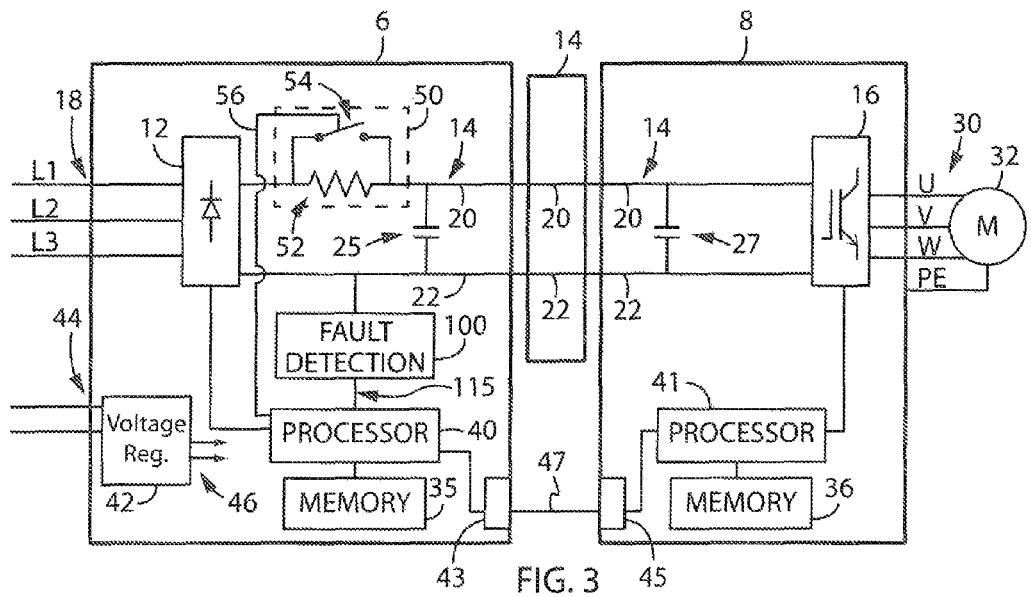
FIG. 3 is a is a schematic representation of a distributed motor drive having a separate diode front end, DC bus, and inverter section according to another embodiment of the invention.
Figure 4:
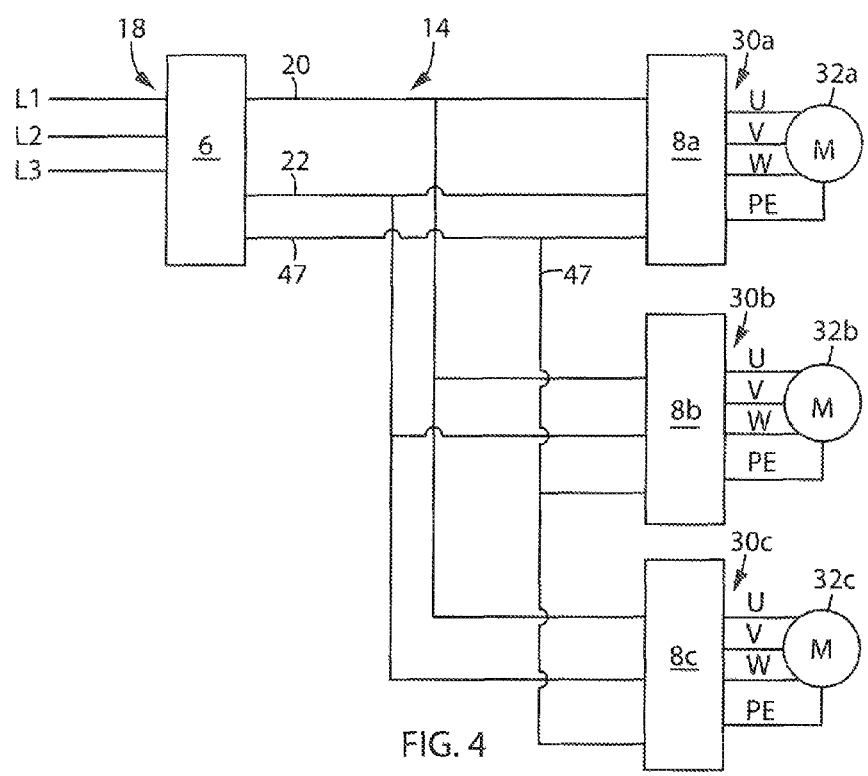
FIG. 4 is a block diagram representation of multiple inverter sections connected to a single diode front end and shared DC bus.

Turning next to FIG. 3, another topology for a motor drive system incorporating one embodiment of the present invention is illustrated. The motor drive system includes a converter module 6, a DC bus 14 section, and an inverter module 8. As further illustrated in FIG. 4, multiple inverter modules 8 may be connected to a common DC bus 14 powered from a single converter module 6. The converter module 6 includes the rectifier section 12, pre-charge circuit 50 and at least a portion of the DC bus capacitance 25. A processor 40 controls operation of the converter module 6 and is connected to a first communication interface 43. The DC bus section 14 includes the positive rail 20 and negative rail 22 conducting the DC bus voltage. As also shown in FIG. 4, the DC bus section 14 may be connected to multiple inverter modules 8a, 8b, 8c.

Each inverter module 8a, 8b, 8c is configured to control the corresponding motor 32a, 32b, 32c connected to the output 30a, 30b, 30c of the inverter module. The inverter module 8 includes the inverter section 16 as discussed above and further includes a separate processor 41 from the converter module 6 and separate non-transitory storage device, or memory 36, configured to store data and programs executable by the processor 41. It is contemplated that the memory 36 may be a single device, multiple devices, or incorporated, for example, as a portion of another device such as an application specific integrated circuit (ASIC). The processor 41 is in communication with the memory 36 to read the instructions and data as required to control operation of the inverter module 8. The processor 41 of the inverter module 8 is connected to a second communication interface 45 and a suitable network medium 47 is connected between the first communication interface 43 and the second communication interface 45 such that the converter module 6 is in communication with each of the inverter modules 8. Each inverter module 8 further includes a DC bus capacitor 27, where the value of the DC bus capacitor 27 in the inverter module 8 is typically less than the value of the DC bus capacitor 25 in the converter module 6.

Figure 5:
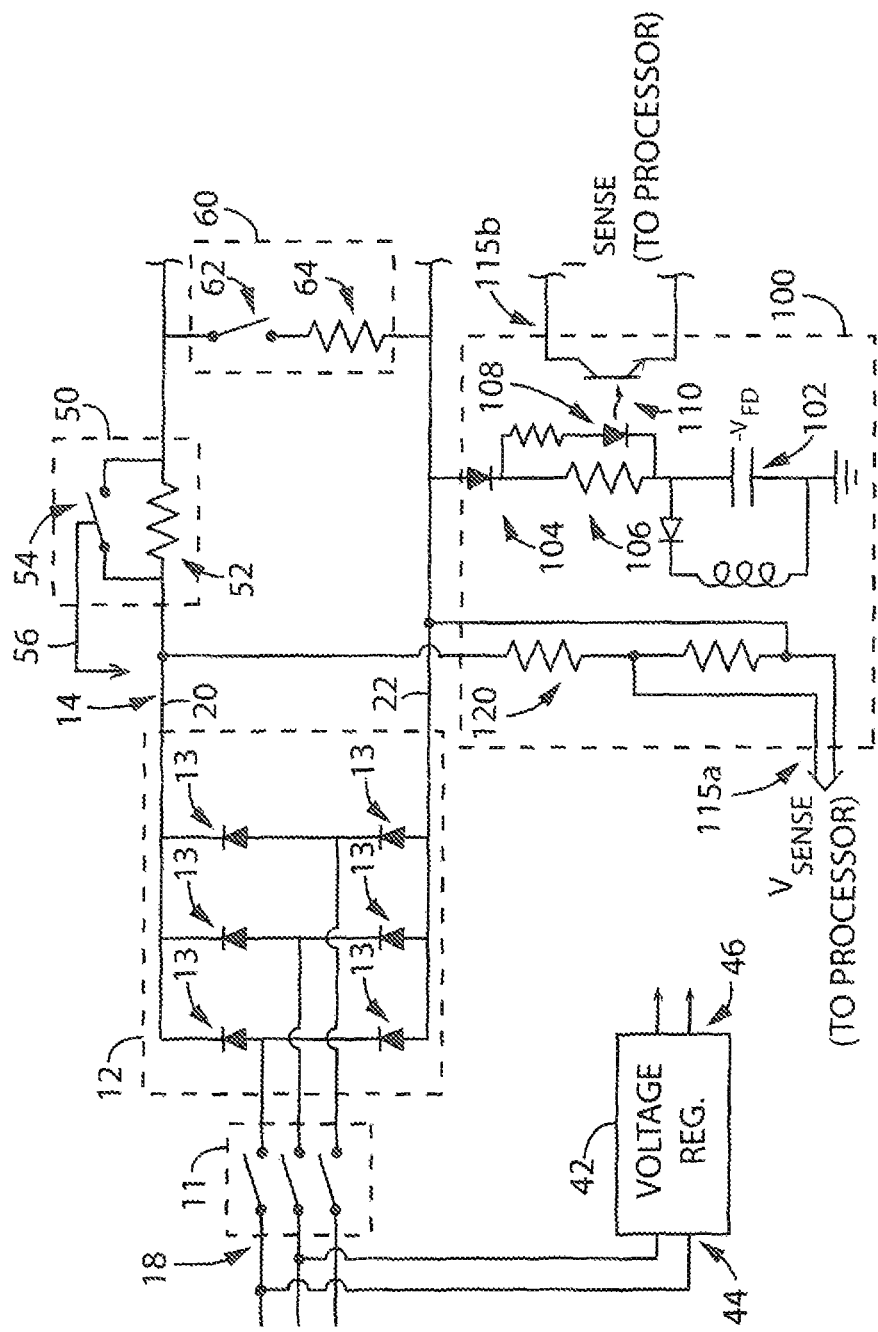
FIG. 5 is a schematic representation of the diode front end of FIG. 3 and one embodiment of the fault detection circuit for the present invention.

Turning next to FIG. 5, additional detail on the connection between an AC input power source 18 and the DC bus 14 is illustrated. It is contemplated that the additional motor drive elements illustrated in FIG. 5 may be included within an ASD as illustrated in FIG. 1 or within a converter module 6 as illustrated in FIG. 3. As previously discussed, a line contactor 11 or other suitable switch may be connected in series between the AC input power 18 and the rectifier module 12. The processor 40 of the ASD 10 or converter module 6 is configured to control operation of the line contactor 11 to determine when the AC power 18 is provided to the rectifier module 12. A voltage regulator 42 within the ASD 10 or converter module 6 receives power at an input 44 and provides control voltages 46 at an output. According to the illustrated embodiment, the input 44 may be connected to one phase of the AC input power 18 ahead of the line contactor 11 such that the voltage regulator 42 always receives input power when the AC input power 18 is present and is able to generate control voltages 46 which may be used, for example, by the processor 40 or other devices within the ASD 10 or converter module 6 prior to closing the line contactor 11. It is contemplated that the control voltages 46 may be any voltage level required within the ASD 10 or converter module 6 including, but not limited to multiple DC voltages between 3-48 volts or 110 VAC.

Figure 8:
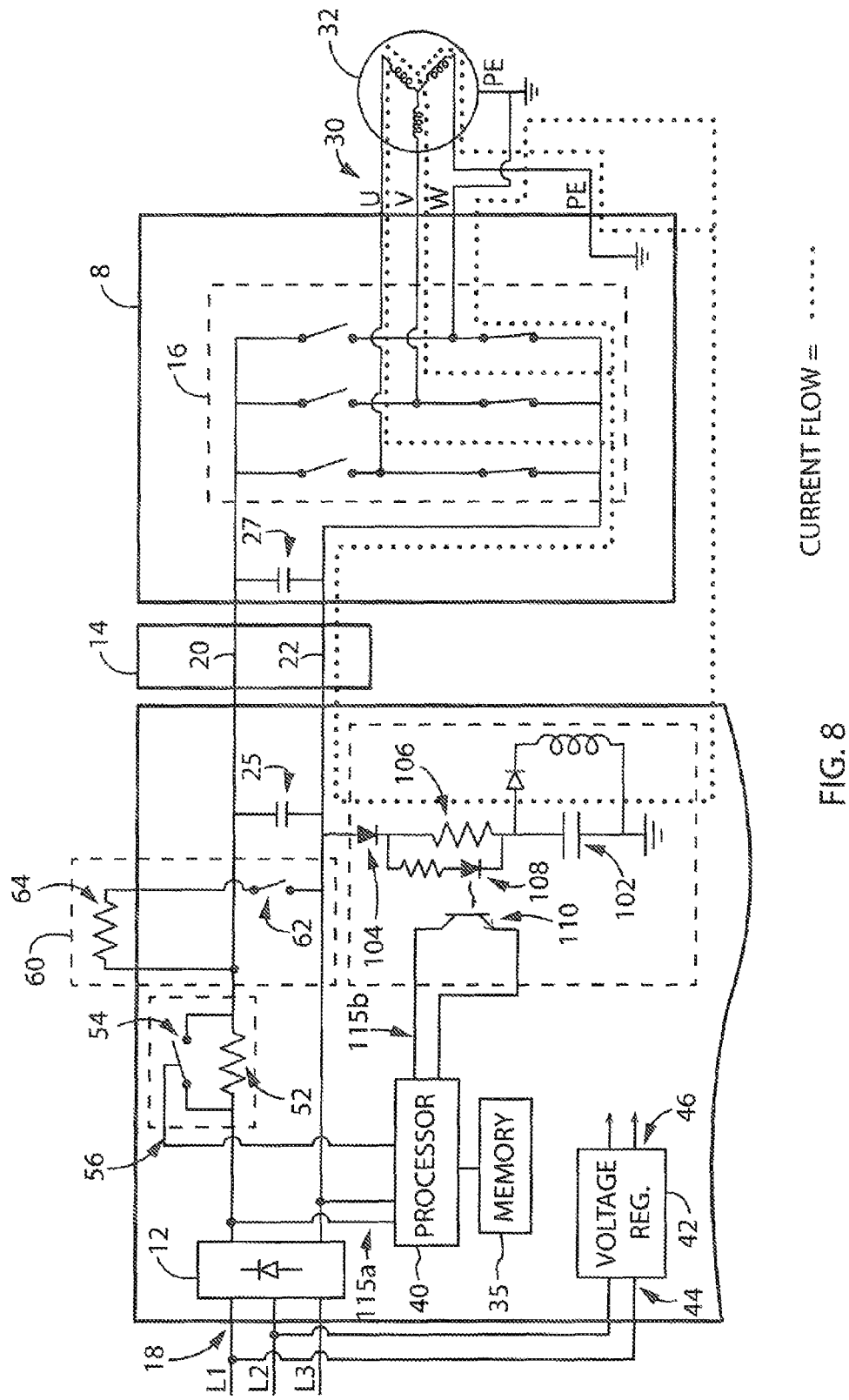
FIG. 8 is a schematic representation of current flow through a distributed motor drive and fault detection circuit according to one embodiment of the invention while a zero voltage vector command is provided to the inverter section.

A shunt circuit 60 is shown connected between the positive rail 20 and the negative rail 22. The shunt circuit 60 includes a switch 62, which may be, for example, a transistor located within the ASD 10 or converter module 6 and controlled by the processor 40. The shunt circuit 60 also includes a resistor 64. It is contemplated that the resistor 64 is a combination of resistors connected in series, in parallel, or a combination thereof to achieve a desired resistance value. In addition, the resistor(s) 64 is(are) preferably power resistors having a power rating sufficient to handle, for example, rated current of an inverter module 8 being provided to the DC bus 14 during regenerative operation at the normal operating voltage, or at an elevated voltage level, present on the DC bus 14. The shunt resistor 64 dissipates excess power on the DC bus 14, typically in the form of heat. Due to the size and power dissipation requirements, the shunt resistor 64 may be mounted external to the ASD 10 or converter module 6 as shown in FIG. 8.

FIG. 5 also illustrates one embodiment of the fault detection circuit 100 according to the present invention. The fault detection circuit 100 includes a power supply 102 operable to provide a test voltage, $V_{FD}$, to the DC bus 14. The illustrated power supply provides a test voltage, $V_{FD}$, having a negative polarity because it is connected to the negative rail 22 of the DC bus 14. It is contemplated that the power supply may be connected to the positive rail 20 utilizing a test voltage with a positive polarity. According to one embodiment of the invention, a control voltage 46, such as −24 VDC, provided from the voltage regulator 42 is used as the test voltage. Thus, the test voltage will always be present when the voltage regulator 42 and the ASD 10 or converter module 6 are receiving control power. Optionally, an external power supply may be used to provide the test voltage. The power supply providing the test voltage is preferably limited to supplying a voltage less than one half the minimum DC bus operating voltage at a current amplitude that is less than the peak current capacity of the smallest rated inverter module 8 expected to be connected to the DC bus 14.

The fault detection circuit 100 further includes a blocking diode 104 connected between the negative rail 22 and the rest of the fault detection circuit 100. At power up and prior to closing the line contactor 11, no voltage is present on the DC bus 14. The negative voltage potential from the test voltage causes the blocking diode 104 to be forward biased, allowing conduction. After the ground fault detection is complete, as will be discussed in more detail below, the processor 40 generates a command signal for the line contactor 11 to close. The voltage potential on the negative rail 22 resulting from application of the AC power source 18 causes the blocking diode 104 to become reverse biased, isolating the fault detection circuit 100 from the DC bus 14 during normal operation of the ASD 10 or converter module 6.

The fault detection circuit 100 is further configured to provide one or more signals 115 to the processor indicating a ground fault is present on the output 30 of the inverter module 8. A first signal 115a corresponds to detecting voltage on the DC bus 14 after supplying the test voltage to the DC bus 14. According to the embodiment illustrated in FIG. 5, a voltage divider circuit 120 is connected between the positive rail 20 and the negative rail 22 of the DC bus 14. Two leads connected on either side of one of the resistors in the voltage divider circuit 120 provide a voltage signal, $V_{sense}$, to the processor 40 indicating a voltage is present on the DC bus 14. After applying the test voltage, if a ground fault is present, there will be a voltage present on the DC bus 14. However, if no ground fault is present, the test voltage will not result in a voltage present on the DC Bus 14. Optionally, the processor may utilize any other voltage feedback signal already existing in the converter module 6. An existing voltage sensor may, for example, measure the voltage across the DC bus. The processor 40 may utilize the existing voltage feedback signal as the voltage single, $V_{sense}$, rather than adding a separate voltage detection circuit within the fault detection circuit 100. According to still other embodiments, the test voltage may be detected by placing a voltage feedback device or circuit at any location along the DC bus 14 and providing the voltage single, $V_{sense}$, back to the processor 40.

The fault detection circuit 100 may also include a voltage limiting resistor 106 and a current sense circuit. The voltage limiting resistor 106 is connected in series with the blocking diode 104. The value of the voltage limiting resistor 106 is preferably selected to limit the current through the fault detection circuit 100 to a magnitude less than the peak current capacity of the smallest rated inverter module 8 expected to be connected to the DC bus 14. The voltage limiting resistor 106 may also be utilized as a current sense resistor. The output 30 of an inverter section 16 may be intentionally shorted together by, for example, a zero voltage command. When a zero voltage command is given in the inverter section 16, each phase of the output 30 is shorted to one of the DC bus rails. If no ground fault exists, each phase of the motor 32 becomes shorted to one of the rails. Because the phases are balanced, little or no current flows through the phases. If, however, one phase of the output 30 is connected to ground, an unbalanced output causes current to flow from the power source 102 through the faulted phase and the DC bus 14 back to the fault detection circuit 100.

The current sense circuit generates a signal 115b indicating current flow through a faulted output phase. When current is flowing through the output, current similarly flows through the fault detection circuit 100. A voltage drop is generated across the voltage limiting resistor 106 due to Ohm's law. A photodiode 108 and a photo receiver 110 may be connected in parallel across the voltage limiting resistor 106 to generate a fault signal responsive to current flowing through the fault detection circuit. The voltage drop across the resistor is sufficient to forward bias the photodiode 108 which in turn transmits a signal to the photo receiver 110. The output of the photo receiver is a fault signal 115 provided to the processor 40 which indicates a ground fault is present on the output of one of the inverter modules 8. Optionally, the voltage potential across the voltage limiting resistor 116 may be supplied as a fault signal directly to the processor 40. It is contemplated that still other methods of detecting current flow through the fault detection circuit 100 and providing a fault signal 115 to the processor 40 indicative of this current flow may be utilized without deviating from the scope of the invention.

Figure 6:
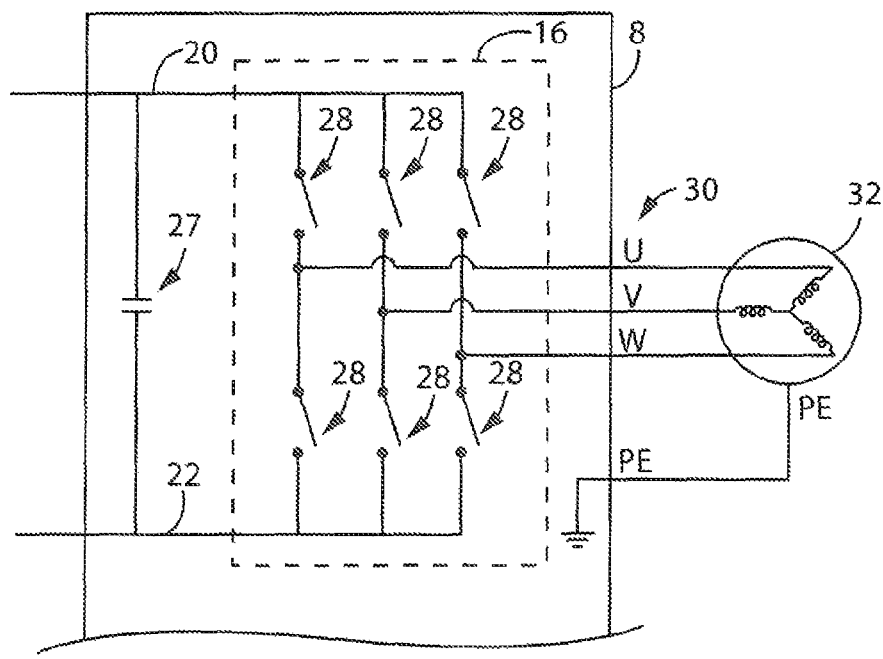
FIG. 6 is a schematic representation of a motor correctly connected to an inverter section.
Figure 7:
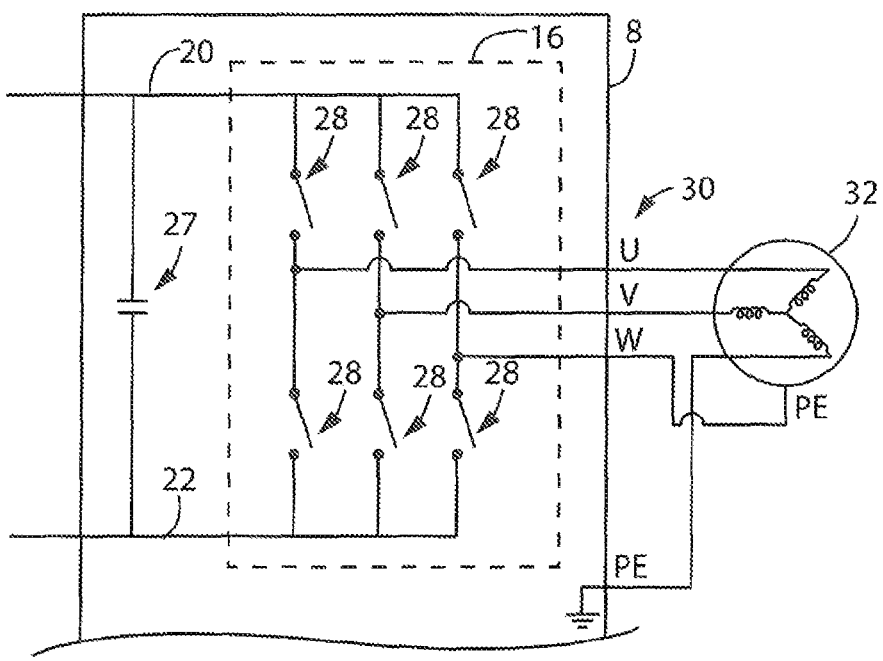
FIG. 7 is a schematic representation of a motor incorrectly connected to an inverter section creating a ground fault at the output of the inverter section.

Turning next to FIGS. 6 and 7, exemplary connections between the inverter section 8 and the motor 32 are illustrated. In FIG. 6, proper connection between the inverter section 8 and the motor 32 is illustrated. Each of the output terminals U, V, and W are connected to one of the phases of the motor 32. A separate conductor is connected between a ground connection, PE, on the motor 32 and another ground connection on the inverter module 8. In contrast, FIG. 7 illustrates one phase of the motor 32 being swapped with the ground connection. The first two phases, U and V, are properly connected. Phase W of the motor 32, however, is connected to the ground connection of the inverter module 8, and the ground connection of the motor 32 is connected to phase W of the output 30 of the inverter module 8. The connection in FIG. 7 creates a ground fault condition at the output 30 of the inverter module 8.

In operation, the ASD 10 or the converter module 6 are configured to detect a ground fault condition during power up, such as may be caused by a wiring error at the output 30 of the inverter module 8. At power-up, the DC bus 14 typically has no voltage potential present between the positive rail 20 and the negative rail 22. However, in certain operating conditions, such as during a quick power cycle, the potential exists for a certain level of DC voltage potential to remain on the DC bus 14. To ensure that voltage potential on the DC bus 14 is zero prior to performing ground fault detection, the processor 40 may generate a command to the shunt switch 62 to close, connecting the shunt resistor 64 between the rails of the DC bus 14 and discharging the existing voltage potential through the shunt resistor 64. When the voltage potential has reached zero or near zero or after a predefined time delay, the processor 40 commands the shunt switch 62 to open, disconnecting the shunt resistor 64 from the DC bus 14. Optionally, the processor 40 may initially read the voltage level present on the DC bus 14 via the voltage sense signal, $V_{sense}$, 115 or via another DC bus voltage feedback signal and determine whether a voltage potential is present on the DC bus 14. After determining whether a voltage potential is present on the DC bus 14, the processor 40 may connect the shunt resistor 64, if necessary, or proceed to the next step in the ground fault detection.

After discharging the voltage potential or verifying that no voltage is present on the DC bus 14, the processor 40 applies the test voltage 102 to the DC bus 14. According to one embodiment of the invention the test voltage 102 is one of the control voltages 46 generated within the ASD 10 or within the converter module 6. Optionally, an external power supply may be provided to supply the test voltage 102. Referring again to FIG. 5, the test voltage 102 is always connected between one rail of the DC bus via the blocking diode 104 and ground. Depending on the polarity of the voltage, the test voltage 102 will be connected either to the negative rail 22 or to the positive rail 20. If no ground fault exists, the test voltage 102 remains isolated from the DC bus via the blocking diode 104 and will not charge the DC bus 14. If, however, a ground fault exists at the output 30 of the inverter module, the test voltage becomes connected to the output via the ground connection and causes one of the freewheeling diodes 17 in the inverter section 16 to become forward biased. The DC bus 14 then charges up to near the potential of the test voltage 102. Voltage potential drops due, for example, to the bias voltage across the blocking diode 104 and/or parasitic components within the system will keep the DC bus 14 from reaching the full potential of the test voltage. A voltage sensing circuit located anywhere on the DC bus 14 can detect the voltage potential resulting from applying the test voltage 102. As shown in FIG. 5, a voltage divider circuit 120 may be provided in the fault detection circuit 100 to generate a voltage sense signal, $V_{sense}$, 115 which is provided to the processor 40. Optionally, an existing sensor or sense circuit within the ASD 10 or converter module 6 provides a voltage feedback signal to the processor 40 indicating the presence of the test voltage on the DC bus 14. According to still other embodiments of the invention, each inverter module 8 may be configured to identify a ground fault condition and have a fault detection circuit 100 located within the inverter module 8.

The time required to charge the DC bus 14 to the test voltage is a function of the impedance elements in the conduction path, including, for example, the DC bus capacitance 25, 27 or the voltage limiting resistor 106. After verifying that there is no voltage present on the DC bus 14, the processor 40 waits for a sufficient time to permit the DC bus 14 to charge up to the test voltage should the ground fault be present. The processor 40 then reads the voltage level on the DC bus 14 to determine whether the test voltage has charged the DC bus 14. If there is a voltage present on the DC bus 14 corresponding to the test voltage, the processor 40 generates a fault signal indicating that a ground fault is present. The fault signal may be communicated back to a central controller, such as a programmable logic controller (PLC), human machine interface (HMI), or other processing device to be reported or logged. When a ground fault is detected, the processor 40 prevents the line contactor 11 from closing such that normal operating voltage is not applied to the DC bus 14.

With reference to FIG. 4, the test voltage may be applied to the DC bus 14 in the converter module 6. If a ground fault exists due to a failure in any of the motor windings, a short between conductors to one of the motors 32, incorrect wiring between the motor 32 and the output 30 on any of the inverter modules 8, or for any other reason, a ground fault will be detected. However, it is desirable to further be able to identify on which inverter 8 and motor 32 pair the ground fault exists.

Having identified that a ground fault exists, an additional fault detection sequence may be implemented to identify in which inverter module 8 the ground fault exists when multiple inverter modules 8 are connected to a shared DC bus 14. A central controller may be configured to sequentially command each of the inverter modules 8 to execute a zero voltage command. According to the illustrated embodiment, it is contemplated that the processor 40 in the converter module 6 may coordinate the sequence. The converter module 6 is in communication with each inverter module 8a, 8b, 8c via the 47 first and second communication ports 43, 45 and the network medium 47 connected between the ports. The processor 40 in the converter module 6 transmits a zero voltage command to each inverter module 8a, 8b, 8c in sequence. While the zero voltage command is being transmitted, the processor 40 monitors the current detection signal 115b to determine whether the particular inverter module 8 receiving the zero voltage command has a ground fault. If no ground fault is present on the inverter module 8 receiving the zero voltage command, then the current detection signal 115b will be off. If, however, a ground fault is present on the inverter module 8 receiving the zero voltage command, then the current detection signal 115b will be on.

A zero voltage command causes the inverter section 16 to short together each of the outputs 30 and, therefore, each phase of the motor 32. As shown in FIG. 8, the lower three transistors 15 are all energized, connecting each phase of the output 30 to the negative rail 22. Optionally, the upper transistors 15 could all be energized, connecting each phase of the output 30 to the positive rail 20. As further indicated in FIG. 8, if a ground fault is present between the motor 32 and the inverter module 8, conduction paths for current flow through the fault detection circuit 100, the ground connection, and the motor 32 as a result of the ground fault are established. The current detection portion of the fault detection circuit includes a photodiode 108 and photo receiver 110 that are energized when current is flowing through the fault detection circuit 100 and, in particular is flowing through the limiting resistor 106 such that a resulting voltage drop across the resistor 106 biases the photodiode 108 and generates a current detection signal 115b at the output of the photo receiver 110.

Although the invention has been discussed with the fault detection circuit 100 located in the converter module 6, it is contemplated that separate fault detection circuits 100 may also be located in each inverter module 8 connected to the DC bus 14. Additional, different figures illustrate difference aspects and/or embodiments of the present invention without including all aspects of the invention in each figure to more clearly illustrate the aspect shown in the figure. It is understood, that portions of or entire figures may be combined in various combinations as would be understood by one skilled in the art without deviating from the scope of the invention.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. A system to detect a ground fault at an output of an inverter, wherein the inverter is connected to a DC bus and wherein the DC bus includes a positive rail and a negative rail, the system comprising:
    a power supply operable to provide a test voltage between one of the positive rail and the negative rail of the DC bus and a ground connection, wherein the test voltage is less than half of a minimum DC bus operating voltage;
    a fault detection circuit operatively connected to the DC bus to generate a fault signal responsive to applying the test voltage on the DC bus when the ground fault is present at the output of the inverter; and
    a control circuit operable to:
        delay a normal DC bus operating voltage from being applied to the DC bus while the test voltage is provided to the DC bus;
        detect the fault signal; and
        prevent the normal DC bus operating voltage from being applied to the DC bus when the fault signal is detected.

2. The system of claim 1 further comprising a voltage sensor generating a voltage signal corresponding to a voltage potential on the DC bus, wherein the fault signal is generated when the voltage signal indicates the test voltage is present on the DC bus.

3. The system of claim 2 further comprising a current detection circuit operatively connected in series with the power supply, wherein the control circuit is operable to generate a zero voltage command to the inverter when the test voltage is present on the DC bus and the current detection circuit generates a signal corresponding to current flowing on the DC bus when the zero voltage command is being generated.

4. The system of claim 2 further comprising a converter module operatively connected between an AC input power source and the DC bus, wherein the fault detection circuit is located within the converter module.

5. The system of claim 4 further comprising a switch connected in series between the AC input power source and an input terminal on the converter module, wherein the switch receives a command signal from the control circuit to selectively disconnect the AC input power source from the input terminal in a first mode and to connect the AC input power source to the input terminal in a second mode.

6. The system of claim 4 wherein the power supply is a control voltage generated within the converter module.

7. The system of claim 6 further comprising a blocking diode operatively connected between the DC bus and the control voltage within the converter module, wherein the blocking diode is reverse biased when the normal DC bus operating voltage is applied to the DC bus.

8. The system of claim 2 further comprising a shunt resistor selectively connectable across the DC bus, wherein the control circuit is further operable to:
    connect the shunt resistor across the DC bus to discharge an existing voltage present on the DC bus prior to applying the test voltage; and
    disconnect the shunt resistor from across the DC bus when the existing voltage has been discharged.

9. A method for detecting a ground fault at an output of an inverter, wherein the inverter is connected to a DC bus and wherein the DC bus includes a positive rail and a negative rail, the method comprising the steps of:
    applying a test voltage between one of the positive rail and the negative rail of the DC bus and a ground connection prior to applying a normal operating voltage on the DC bus, wherein the test voltage is less than half of a minimum DC bus operating voltage;
    detecting a voltage potential on the DC bus with a voltage sensor when the test voltage is applied to the DC bus;
    generating a fault signal with a fault detection circuit when the voltage potential on the DC bus is detected; and
    preventing the normal operating voltage from being applied to the DC bus with a control circuit when the fault signal is generated.

10. The method of claim 9 wherein a switch and a converter module are operatively connected between an AC input power source and the DC bus, the method further comprising an initial step of commanding the switch to open and wherein the step of preventing the normal operating voltage from being applied to the DC bus includes keeping the switch open.

11. The method of claim 9 wherein a shunt resistor is selectively connectable across the DC bus, the method further comprising the initial steps of:
    connecting the shunt resistor across the DC bus to discharge an existing voltage present on the DC bus; and
    disconnecting the shunt resistor from across the DC bus when the existing voltage has been discharged.

12. The method of claim 9 wherein a plurality of inverters are connected to the DC bus, the method further comprising the steps of:
    applying a zero voltage vector command to each of the plurality of inverters in sequence when the test voltage is present on the DC bus;
    detecting current flow on the DC bus with a current detection circuit operatively connected in series with the power supply when the zero voltage vector is commanded; and
    identifying which of the plurality of inverters has the zero voltage vector command applied when the current flow on the DC bus is detected.

13. A system to detect a ground fault in a motor drive system, the motor drive system having a converter module operatively connected between an AC input power source and a DC bus and a plurality of inverters operatively connected to the DC bus, wherein the DC bus includes a positive rail and a negative rail, the system comprising:
    a power supply operable to provide a test voltage between one of the positive rail and the negative rail of the DC bus and a ground connection, wherein the test voltage is less than half of a minimum DC bus operating voltage;
    a fault detection circuit located within the converter module and operatively connected to the DC bus to generate a fault signal responsive to applying the test voltage when the ground fault is present at an output of one of the plurality of inverters; and a control circuit within the converter module operable to:

delay a normal DC bus operating voltage from being applied to the DC bus while the test voltage is provided to the DC bus;

detect the fault signal; and prevent the normal DC bus operating voltage from being applied to the DC bus when the fault signal is detected.

14. The system of claim 13 further comprising a voltage sensor generating a voltage signal corresponding to a voltage potential on the DC bus, wherein the fault signal is generated when the voltage signal indicates the test voltage is present on the DC bus.

15. The system of claim 14 further comprising a current detection circuit operatively connected in series with the power supply, wherein the control circuit is operable to generate a zero voltage command to each of the plurality of inverters when the test voltage is present on the DC bus and the current detection circuit generates a signal corresponding to current flowing on the DC bus when the zero voltage command is being generated.

16. The system of claim 15 further comprising a blocking diode operatively connected between the DC bus and the control voltage within the converter module, wherein the blocking diode is reverse biased when the normal DC bus operating voltage is applied to the DC bus.

17. The system of claim 14 wherein the power supply is a control voltage generated within the converter module.

18. The system of claim 14 further comprising a shunt resistor selectively connectable across the DC bus, wherein the control circuit is further operable to:

connect the shunt resistor across the DC bus to discharge an existing voltage present on the DC bus prior to applying the test voltage; and disconnect the shunt resistor from across the DC bus when the existing voltage has been discharged.

19. The system of claim 13 further comprising a switch connected in series between the AC input power source and an input terminal on the converter module, wherein:

the switch receives a command signal from the control circuit to selectively disconnect the AC input power source from the input terminal in a first mode and to connect the AC input power source to the input terminal in a second mode, and the control circuit generates the command signal for the switch to operate in the first mode to delay the normal DC bus operating voltage from being applied to the DC bus while the test voltage is provided to the DC bus and to prevent the normal DC bus operating voltage from being applied to the DC bus when the fault signal is detected.

20. The system of claim 19 further comprising:

a first communication interface in the converter module; and a second communication interface in each of the plurality of inverters, wherein the first communication interface and each of the second communication interfaces are in communication with each other, wherein the control circuit is further operable to:

send a zero voltage vector command to each of the plurality of inverters in sequence; and identify which of the plurality of inverters has the zero voltage vector command applied when the fault signal is generated.

* * * * *